US010873295B1

United States Patent
Wilson (10) Patent No.: US 10,873,295 B1
(45) Date of Patent: Dec. 22, 2020

(54) AMPLIFIER CIRCUITRY

(71) Applicant: Cirrus Logic International Semiconductor Ltd., Edinburgh (GB)

(72) Inventor: Paul Wilson, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/599,600

(22) Filed: Oct. 11, 2019

Related U.S. Application Data (60) Provisional application No. 62/883,275, filed on Aug. 6, 2019.

(51) Int. Cl.
*H03F 1/02* (2006.01)
*H03F 3/45* (2006.01)
*H04R 19/04* (2006.01)
*H04R 3/00* (2006.01)

(52) U.S. Cl.
CPC ....... *H03F 1/0211* (2013.01); *H03F 3/45071* (2013.01); *H04R 3/00* (2013.01); *H04R 19/04* (2013.01); *H03F 2200/03* (2013.01); *H03F 2200/129* (2013.01); *H03F 2200/165* (2013.01); *H03F 2200/228* (2013.01); *H03F 2200/234* (2013.01); *H03F 2200/267* (2013.01); *H03F 2200/294* (2013.01); *H03F 2200/318* (2013.01); *H03F 2203/45116* (2013.01); *H04R 2201/003* (2013.01)

(58) Field of Classification Search
USPC .............. 381/28, 57, 95, 113, 120, 121, 161
See application file for complete search history.

(56) References Cited

U.S. PATENT DOCUMENTS 7,071,780 B2 * 7/2006 Van Zanten ............ H03F 1/086
330/258
9,484,872 B1 * 11/2016 Conte ..................... G11C 5/145

* cited by examiner

*Primary Examiner* — Yosef K Laekemariam
(74) *Attorney, Agent, or Firm* — Jackson Walker L.L.P.

(57) ABSTRACT

This application relates to amplifier circuitry for amplifying an input signal from a MEMS capacitive sensor. The amplifier circuitry includes a first amplifier for receiving the input signal ($V_{INP}$) and outputting a first output signal ($V_{OUTP}$) based on the input signal. A second amplifier is configured to output a second output signal ($V_{OUTN}$) which varies inversely with the first output signal. The first and second amplifier outputs are connected via first and second impedances so that a voltage at a common-mode node is equal to a common-mode voltage of the first and second output signals. The second amplifier has an input stage having an input terminal connected to a first reference voltage ($V_{R1}$) and a feedback terminal connected to the common-mode node. The second amplifier also has an output stage connected between an output terminal of the input stage and the second amplifier output.

20 Claims, 7 Drawing Sheets

AMPLIFIER CIRCUITRY

FIELD OF DISCLOSURE

The field of representative embodiments of this disclosure relates to methods, apparatus and/or implementations concerning or relating to operation of amplifier circuitry, and especially to the readout and amplification of signals from Micro-electromechanical-system (MEMS) sensors, such as MEMS microphones.

BACKGROUND

MEMS sensors, such as MEMS capacitive microphones, are becoming increasing popular, at least partly due to their small size. For instance MEMS microphones may usefully be employed on portable electronic devices such as mobile telephones or tablet computers and the like. The increasing popularity of voice control is also leading to microphones being provided on a range of devices, such as smart watches or other wearable devices or on other consumer electronics products and MEMS microphones are being usefully used on such products.

MEMS capacitive microphones typically comprise two electrodes, which are moveable with respect to one another in response to incident acoustic waves, so as to form a variable capacitance, typically of the order of 1 pf or so. A first one of the electrodes may be biased by a relatively high stable bias voltage $V_{BIAS}$, say 12V or so in some instances, whilst the second electrode is biased to another fixed voltage $V_{REF}$, typically ground, via a very high impedance, for example, in the order of 10 GΩ. Acoustic waves incident on the capacitive transducer changes the spacing between these electrodes and hence the inter-electrode capacitance. As the second electrode of the transducer is biased via a very high impedance, these changes in capacitance result in an input signal voltage.

Given the small capacitance of the MEMS sensor the input signal is relatively small. Thus noise is one concern for such MEMS sensor arrangements and typically the signal is amplified by a low-noise amplifier arrangement.

Another issue that arises for such MEMS microphones is providing sufficient dynamic range. To provide acceptable output signal levels at lower input acoustic signal level requires a certain amplifier gain. However at higher acoustic signal levels this can result in overload, where the resulting relatively large input signal magnitude exceeds the linear range of the amplifier at the input and/or output and distortion is introduced. In most cases the maximum signal level that can be amplified is limited by the power supply voltage minus headroom.

SUMMARY

Embodiments of the present disclosure are thus directed at methods and apparatus for amplification and/or read-out of signals, in particular from MEMS sensors, that at least mitigate at least some of the above mentioned issues.

According to an aspect of the disclosure there is provided amplifier circuitry for amplifying an input signal from a MEMS capacitive sensor. The amplifier circuitry comprises a first amplifier having an input for receiving the input signal and configured to output, at a first amplifier output, a first output signal based on the input signal. A second amplifier is configured to output, at a second amplifier output, a second output signal which varies inversely with the first output signal. The first amplifier output is connected to the second amplifier output via first and second impedances so that a voltage at a common-mode node between the first and second impedances is equal to a common-mode voltage of the first and second output signals. The second amplifier comprises: an input stage having an input terminal connected to a first reference voltage and a feedback terminal connected to the common-mode node; and an output stage connected between an output terminal of the input stage and the second amplifier output.

In some implementations the amplifier circuitry further comprises biasing circuitry for generating a bias voltage for biasing the MEMS capacitive sensor at a biasing node. The amplifier circuitry may be configured to modulate the bias voltage at the bias node with a bias modulation signal that includes a component corresponding to any noise at the feedback terminal of the input stage of the second amplifier. The bias modulation signal may be supplied via a feedback path. In some examples the feedback path may extend between the common mode node and the biasing node. In other examples the bias modulation signal may be based on the second output signal, in which case the feedback path may extend between a node connected to the second amplifier output and the bias node. The feedback path may comprise a biasing capacitor.

In some implementations the first amplifier may comprise: an input stage configured to receive the input signal and a feedback signal from first amplifier output; and an output stage coupled between an output terminal of the input stage of the first amplifier and the first amplifier output. In some implementations a current source may be coupled to feedback terminal of the input stage of the first amplifier.

The output stage of the first amplifier may be configured to receive a second voltage reference. In some embodiments the amplifier circuitry may be configured to modulate the second voltage reference at the output stage with a reference modulation signal that includes a component corresponding to any noise at the feedback terminal of the input stage of the second amplifier. The common-mode node may be connected to a reference voltage input of the output stage of the first amplifier via a capacitor and the reference voltage input may be connected to the second voltage reference via an impedance element.

In some examples a first gain resistor may be coupled between the first amplifier output and the feedback terminal of the input stage of the first amplifier, and a second gain resistor coupled between the second amplifier output and the feedback terminal of the input stage of the second amplifier.

In some examples a gain capacitance may be coupled between the bias node and the first amplifier output.

In some examples the input terminal of the second amplifier may be connected to the first reference voltage via a second amplifier reference path that comprises an impedance element. In some examples a filter capacitor is connected to the gate reference path.

In some examples the input to the first amplifier may be coupled to the first reference voltage via an first amplifier reference path that comprises an impedance element.

In some implementations the input stage of the second amplifier may comprise an input transistor having: a gate terminal configured as the input terminal; a source terminal coupled as the feedback terminal; and a drain terminal coupled to a second amplifier current source and configured as said output terminal of the input stage of the second amplifier.

Embodiments also relate to amplifier circuitry including a MEMS capacitive sensor configured to generate, in use, the input signal. The MEMS capacitive sensor may be a MEMS microphone.

The amplifier circuitry may be implemented as an integrated circuit.

Embodiments also relate to an electronic device comprising amplifier circuitry according to any of the variants discussed herein. The device may be at least one of: a portable device;

a battery powered device; a communication device; a mobile telephone; a computing device;

a tablet, laptop or notebook computer; a wearable device; a voice controlled device.

In another aspect there is provided an amplifier apparatus for amplifying an input signal from a MEMS capacitive sensor comprising:

a first op-amp configured to receive the input signal as an input and output a first output signal based on the input signal;

a second op-amp configured to receive a reference voltage as an input and to output a second output signal, wherein an input stage of the second op-amp is configured to receive a feedback from both the second output signal and the first output signal such that the voltage at the source terminal corresponds to a common-mode voltage of the first and second output signals.

The first and/r second op-amps may be implemented as super-source-follower amplifiers.

In another aspect there is provided an amplifier circuitry for amplifying an input signal from a MEMS capacitive sensor comprising:

a first amplifier having an input for receiving the input signal and configured to output, at a first amplifier output, a first output signal based on the input signal;

a second amplifier configured to output, at a second amplifier output, a second output signal which varies inversely with the first output signal;

wherein the second amplifier comprises:

an input transistor having a gate terminal connected to a first reference voltage; a source terminal connected a common-mode node; and a drain terminal connected to a current source; and an output driver connected between the drain terminal of the input transistor and the second amplifier output; and wherein the amplifier circuitry is configured such that, in use, a voltage at the common-mode node corresponds to a common-voltage of the first and second output signals.

Unless expressly indicated to the contrary, any of the various features of the various implementations discussed herein may be implemented together with any one or more of the other described features in any and all suitable combinations.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 1:
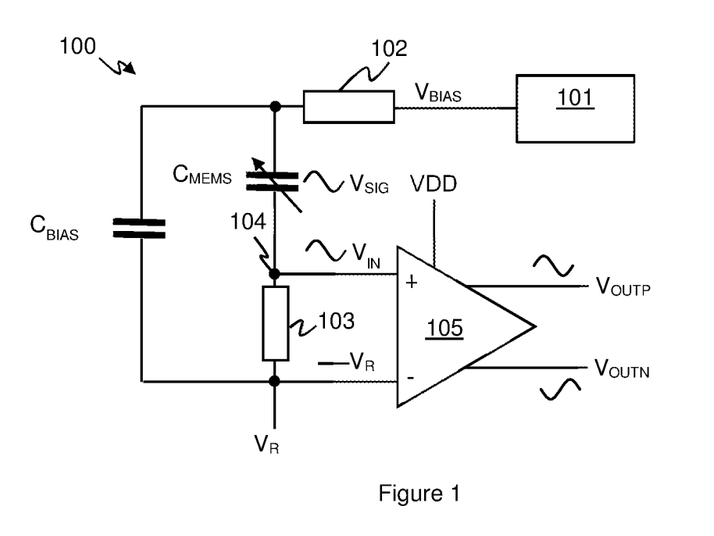
FIG. 1 illustrates one example of a MEMS sensor apparatus with a single-ended input amplifier.

FIG. 1 illustrates one example of a conventional MEMS sensor arrangement 100 for operation of a MEMS capacitive sensor, such as a MEMS microphone. The MEMS microphone is illustrated as a variable capacitance $C_{MEMS}$. A first electrode or plate of the MEMS sensor $C_{MEMS}$ is biased with a biasing voltage $V_{BIAS}$ from a voltage source 101. The voltage source 101 may, for instance be a charge-pump, which may boost an input voltage, to the defined bias voltage $V_{BIAS}$. The bias voltage $V_{BIAS}$ may be applied to the first electrode via filter arrangement comprising resistance 102 (for instance comprising polysilicon diodes) and a biasing capacitor $C_{BIAS}$ to provide a stable biasing voltage for the transducer.

A second plate or electrode of the MEMS capacitive transducer $C_{MEMS}$ is coupled to a reference voltage $V_R$ via a high impedance element 103, which may for instance be in the order of gigaohms or so. High impedance element 103 may, for instance, comprise polysilicon diodes or similar.

The capacitance of the MEMS sensor $C_{MEMS}$ is typically only of the order of 1 pf or so, and so the sense signal received at a sense node 104 connected to the second plate requires local buffering/amplification. A voltage amplifier 105 may thus be arranged to generate a buffered voltage output. The amplifier 105 may present a high input impedance, so the charge on the MEMS capacitance remains constant. The voltage at the sense node 104 connected to the second plate thus varies inversely proportional to the capacitance, which itself is inversely proportional to the plate separation, so overall the detected voltage VIN is dependent on the displacement of the plates of the MEMS capacitive sensor $C_{MEMS}$. Pressure waves cause displacement of the plates of the MEMS capacitive sensor $C_{MEMS}$ which results in a voltage variation $V_{SIG}$ which is detected as the input voltage VIN from the sense node and amplified by amplifier 105.

In the example illustrated in FIG. 1 the amplifier 105 is configured to provide a differential output signal, i.e. outputs of $V_{OUTP}$ and $V_{OUTN}$ which vary inversely from one another to provide a differential voltage that varies with the input signal VIN. The amplifier 105 thus also receives the voltage reference $V_R$. Providing a differential output signal can improve noise performance by increasing the power-supply-rejection-ratio (PSRR) of the MEMS sensor arrangement. A differential output has a benefit because the maximum differential output signal is twice Vdd minus headroom.

In the arrangement illustrated in FIG. 1, the maximum input signal that can be amplified linearly is limited by the input range of amplifier 105, e.g. the power supply voltage VDD minus sufficient headroom. There is an increasing demand for microphones to be able to operate in noisy environments or environments with large low frequency components such as wind noise without distorting and thus there is a general desire to improve the linear operating range of the microphone arrangement, i.e. to improve overload performance by being able to cope with a high input sound pressure level without clipping.

The operating range of the amplifier may be increased by increasing the supply voltage but this would increase power consumption, which is undesirable, especially for portable devices which operate using battery power and where battery life is an important consideration. An increased supply voltage would also result in increased supply noise if, for example, a DC-DC converter was used to boost the supply voltage.

Dynamic range has been extended by using the techniques of compression to vary the sensitivity of the microphone, for instance by reducing the bias voltage $V_{BIAS}$ for larger amplitude acoustic signals so as to reduce the voltage of the signal VIN at the sense node. However this results in the overall response of the microphone being non-linear or time-varying or subject to transient artefacts as $V_{BIAS}$ is changed which may be undesirable in some implementations.

The dynamic range of the amplifier can be improved by effectively converting the single-ended input signal into a differential input. This can extend the input range of the amplifier from being equal to the supply voltage less headroom to being double the supply voltage less headroom. Thus the operating range of the amplifier is improved, without requiring any increase in supply voltage or any negative impact on PSRR. This increase in linear operating range not only increases the range of sound pressure level (SPL) that can be detected accurately, but the increased operating range available may allow for a greater freedom in the design of various system parameters such as transducer sensitivity and amplifier gain, which can allow for a reduction in overall noise.

One option for generating a differential input would be to use an inverting amplifier. For instance, instead of coupling an input of amplifier 105 to the reference voltage, an inverting amplifier could be arranged between the sense node and the relevant input to provide a complementary input signal for the amplifier 105. However, the inverting amplifier would itself be an additional source of noise which could introduce noise into the output signal.

It has alternatively been proposed to generate the complementary differential input from a common mode feedback signal.

Figure 2:
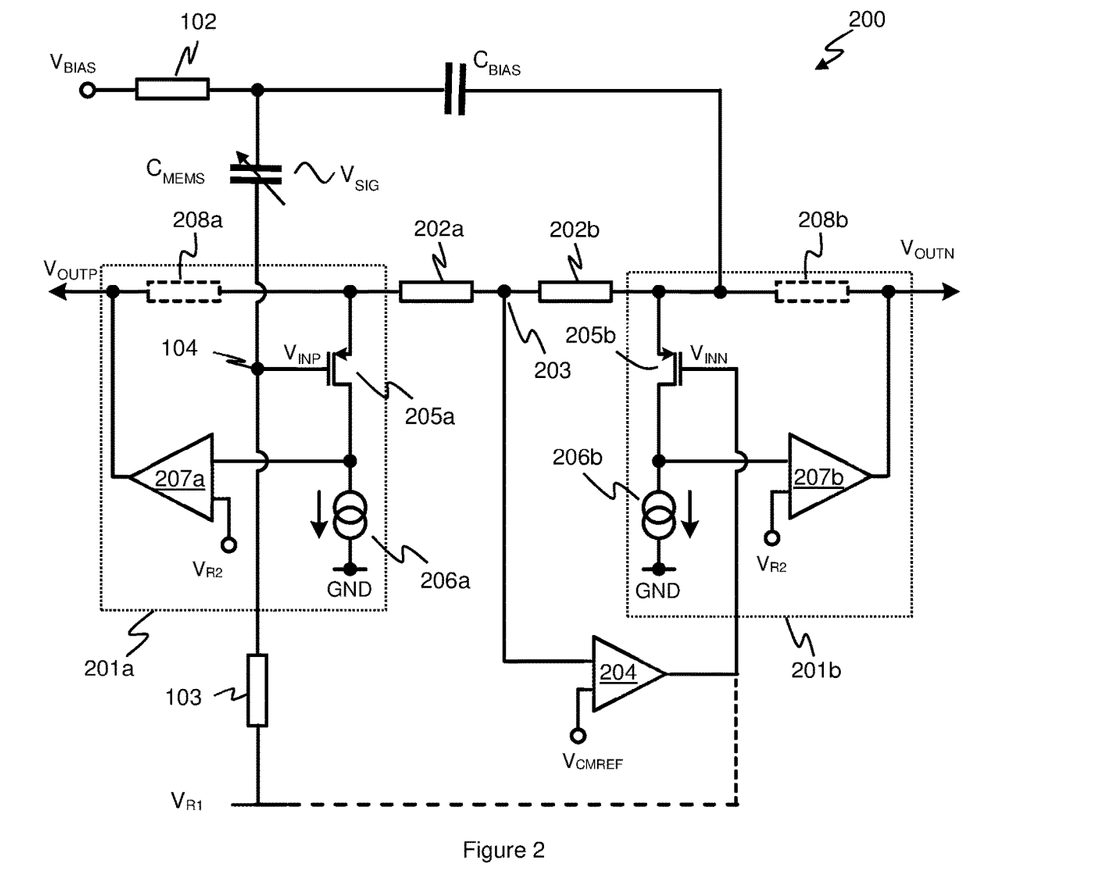
FIG. 2 illustrates one example of a MEMS sensor amplifier arrangement which generates a differential input signal.

FIG. 2 illustrates an example of such an amplifier arrangement 200. Again a bias voltage $V_{BIAS}$ is applied to one plate of the MEMS capacitive sensor $C_{MEMS}$, whilst the other plate is coupled to high impedance element 103, which results in an input signal $V_{INP}$ at sense node 104. In this case a first single-ended low-noise amplifier (LNA) 201a is arranged to receive and amplify this input signal to generate an output signal $V_{OUTP}$. A second single-ended LNA 201b is driven by an input $V_{INN}$ to provide an output signal $V_{OUTN}$. The two outputs are connected on either side of impedances 202a and 202b, which in this example are resistances 202a and 202b of equal resistance, so that the midpoint voltage at node 203 between these resistances can be tapped as a common-mode voltage.

Amplifier 204 is arranged in a feedback path between the common-mode tap point 203 and the input to the second LNA 201b. Amplifier 204 receives the common-mode voltage and a reference $V_{CMREF}$. This feedback path, in effect, tries to maintain the common-mode voltage to be a constant value based on $V_{CMREF}$. Amplifier 204 may be relatively high gain amplifier and thus drives the output $V_{OUTN}$ of LNA 201b to be the inverse of the output of LNA 201a so as to maintain the common-mode voltage. Thus the signal $V_{INN}$ generated by amplifier 204 is the inverse of input signal $V_{INP}$ and the outputs of LNAs 201a and 201b are complementary and provide a differential output.

The LNAs 201a and 201b may be implemented as source-follower type amplifiers, for example as super-source followers, and, in the example of FIG. 2, LNA 201a has an input transistor 205a, e.g. a PMOS, in series with a current source 206a. The voltage at the drain of the input transistor 205a drives class AB output driver 207a which provides the output signal, which is fed back to the source of the input transistor. LNA 201b has corresponding components (designated by the suffix b). This arrangement, as will be understood by one skilled in the art, drive the respective output $V_{OUTP}$ or $V_{OUTN}$ to vary with the respective input $V_{INP}$ or $V_{INN}$. In some implementations resistors 208a and 208b could be implemented within the amplifiers 201a and 201b to provide gain. The high impedance element 103 may be coupled between the input node 104 and a defined reference voltage $V_{R1}$, although in some embodiments the high impedance element could be coupled between the input node 104 and input signal $V_{INN}$, i.e. an input for the second LNA 201b.

In the example of FIG. 2, the bias capacitor $C_{BIAS}$ may be coupled between the biasing node for the MEMS capacitance $C_{MEMS}$ and a node which varies based on the signal $V_{INN}$. In the absence of any gain resistor 208b the bias capacitor $C_{BIAS}$ could be coupled to the output for output signal $V_{OUTN}$. If gain resistor 208b is present the bias capacitor could be coupled on the opposite side of the gain resistor 208b to this output. Any variation in the generated signal $V_{INN}$ is thus imposed on MEMS capacitive sensor via the bias capacitor $C_{BIAS}$. If a variation of the separation of the plates or electrodes of MEMS sensor $C_{MEMS}$ gives rise to a voltage variation $V_{SIG}$, this will lead to the input signal $V_{INP}$ varying. However the signal $V_{INN}$ will be generated to exhibit the opposite variation, which will be imposed on MEMS capacitance $C_{MEMS}$. Thus if a stimulus on the MEMS sensor $C_{MEMS}$ gives to a voltage variation of $\Delta V$, as the signal $V_{INP}$ varies, the signal $V_{INN}$ will vary in the opposite sense. Thus each of $V_{INP}$ and $V_{INN}$ will exhibit an equal and opposite variation of magnitude $\Delta V/2$. As such each input signal $V_{INP}$ and $V_{INN}$ is half the magnitude, for a given signal voltage variation $V_{SIG}$, compared to the single-ended input version described with reference to FIG. 1. The differential input signal level is thus equal to $V_{INP}-V_{INN}$ and has substantially double the input range compared to the single-ended input signal $V_{IN}$.

Any noise introduced by the second LNA 201b is suppressed through the action of the feedback path including the common-mode feedback amplifier 204. That is, the LNA 201b is within a feedback loop for the common-mode feedback amplifier 204. Noise introduced by the common-mode feedback amplifier 204 and/or arising on the reference $V_{CMREF}$ will appear as common mode noise only and may be readily rejected by downstream components receiving the output signals $V_{OUTP}$ and $V_{OUTN}$, e.g. an audio codec or the like.

The arrangement illustrated in FIG. 2 thus provides an amplifier arrangement for MEMS sensors with good dynamic range and good noise performance.

However there is an ongoing desire for improved noise and/or dynamic range performance and/or for amplifier circuitry to be small and/or power efficient. Embodiments of the present disclosure relate to improved methods and apparatus for amplification, especially for MEMS capacitive sensor and to MEMS sensor arrangements.

Figure 3:
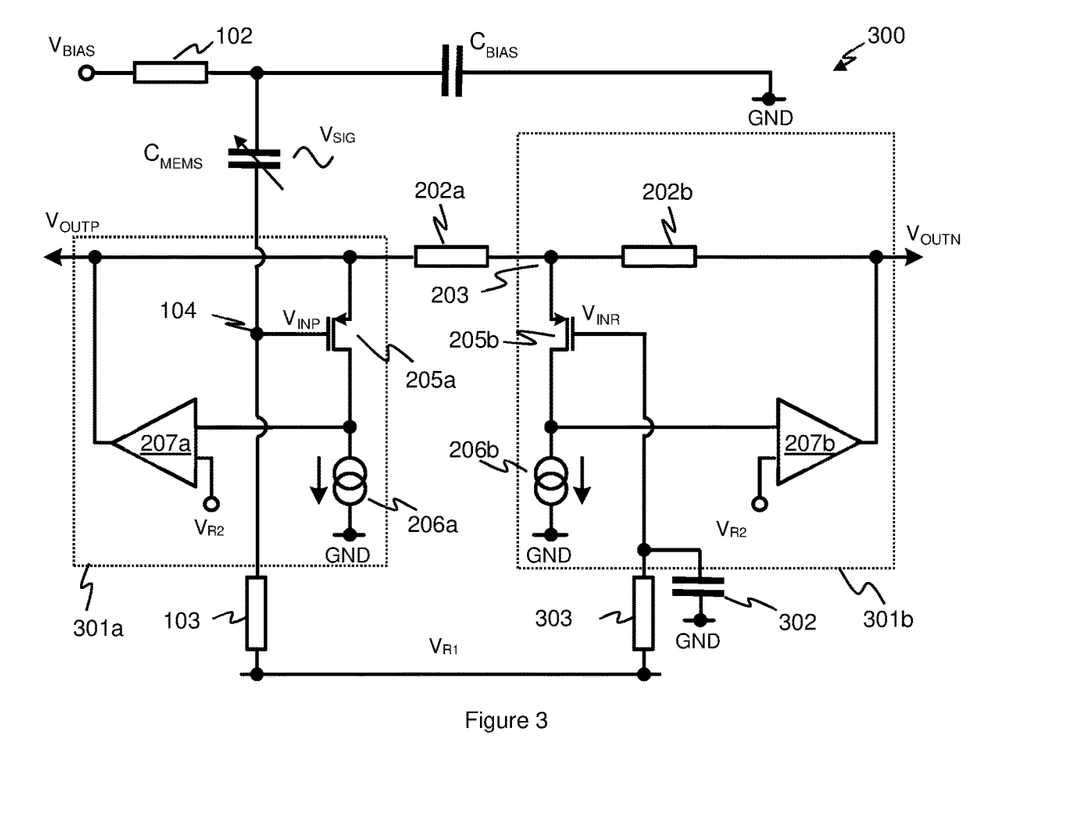
FIG. 3 illustrates an example of a MEMS sensor amplifier arrangement according to an embodiment.

FIG. 3 illustrates one example of a MEMS sensor arrangement 300 according to an embodiment of the disclosure. Similar components to those described previously are identified by similar reference numerals.

FIG. 3 again shows that a first plate or electrode of the MEMS capacitive sensor $C_{MEMS}$ is supplied with a bias voltage $V_{BIAS}$, for example from a suitable DC-DC converter such as a charge pump or the like (not illustrated in FIG. 3) in a similar manner as discussed above. The second plate or electrode of the MEMS capacitive sensor $C_{MEMS}$ is coupled to a reference voltage $V_{R1}$ via a high impedance element 103 which may, for example, comprise polysilicon diodes or the like.

The amplifier arrangement of FIG. 3 includes a first amplifier 301a and a second amplifier 301b to provide respective buffered output signals $V_{OUTP}$ and $V_{OUTN}$ at first and second amplifier outputs. First and second impedances 202a and 202b are connected in series between the two outputs so that the mid-point voltage at node 203, between the impedances, is equal to the output common-mode voltage in a similar manner as discussed above with reference to FIG. 2. FIG. 3 illustrates that the impedances may be equal resistances 202a and 202b but, in some implementations, the impedances may additionally or alternatively comprise capacitances.

Amplifiers 301a and 301b may be low-noise amplifiers as discussed above and may be configured as an op-amp with an input stage 205a/205b and an output stage 207a/207b. In the example of FIG. 3, the amplifiers are implemented as source-follower type amplifiers, e.g. super-source followers. In the example illustrated in FIG. 3 each amplifier 301a and 301b comprises an input stage transistor 205a/205b, with current source 206a/206b and an output stage that comprises a class AB driver 207a/207b. The output stages 207a/207b are arranged as inverting stages so as to provide negative feedback.

The signal at sense node 104 provides an input signal $V_{INP}$ for amplifier 301a, which operates to generate the output signal $V_{OUTP}$ in a similar way as discussed with reference to FIG. 2. In the embodiment of FIG. 3, however, the source of input transistor 205b of LNA 301b is coupled to the common-mode node 203 so that this node provides a feedback input for the input stage of amplifier 301b. The input signal $V_{INR}$ for the input stage 205b is derived from reference $V_{R1}$, via a high impedance element 303 which may be an impedance element similar to high impedance element 103 discussed above. Reference $V_{R1}$, as illustrated, is conveniently the same reference to which the sense node 104 is coupled via high impedance element 103. Filter capacitance 302 is connected between the signal path for $V_{INR}$ and a defined voltage, in this case ground, so as to form at least part of a low-pass filter with high impedance 303.

As will be understood by one skilled in the art, amplifier 301b thus operates as a type of super-source follower, but the feedback to the input stage 205b, in this example to the source node of input transistor 205b, is derived not just from the output $V_{OUTN}$ of the amplifier, but there will also be some feedback from the output $V_{OUTP}$. In effect the input stage of second amplifier 301b receives feedback from both output signals so the voltage at node 203, which defines the source voltage of input transistor 205b, is equal to the common-mode voltage of the output signals.

The input $V_{INR}$ to the second LNA 301b is a constant voltage defined by the reference $V_{R1}$. In a super-source follower arrangement, if the input voltage is constant, the feedback from the output to the source of input transistor 205 would tend to maintain the output voltage constant, so as to maintain a constant gate-source voltage for transistor 205.

In the example of FIG. 3, any variation of the output signal $V_{OUTP}$ could cause a variation of the source voltage for the input transistor of LNA 301b. In this case, output driver 207b will thus be driven to produce an output signal $V_{OUTN}$ that counteracts the effect of the variation in output signal $V_{OUTP}$, so as to maintain the voltage at node 203. Therefore, in the case where 202a and 202b are equal impedance, the output $V_{OUTN}$ of LNA 301b is equal and opposite to the output $V_{OUTP}$ of LNA 301a.

This arrangement offers many of the benefits of the sensor arrangement discussed above, but can be implemented with fewer components. The arrangement of FIG. 3 does not require common-mode amplifier 204, and the associated power and area requirement for such a component. This also removes the common-mode amplifier 204 as a possible source or noise and/or offset. It also removes the need for separate reference $V_{CMREF}$ to be generated, and also thus avoid the circuit area and power requirements associated with generating this reference, which itself could be a source of noise.

Further, for the sensor arrangement 200 illustrated in FIG. 2, the voltage excursion for the output signal $V_{OUTN}$ is limited on the low side to be greater than ground, due to the output signal $V_{OUTN}$ being defined by the output single-ended common mode amplifier 204 and the gate-source voltage of transistor 205b. In the arrangement 300 of FIG. 3, the excursion of the output signal $V_{OUTN}$ is limited only by output driver 207b. Therefore 300 has a larger linear output signal range than 200 which improves AOP performance.

Figure 4:
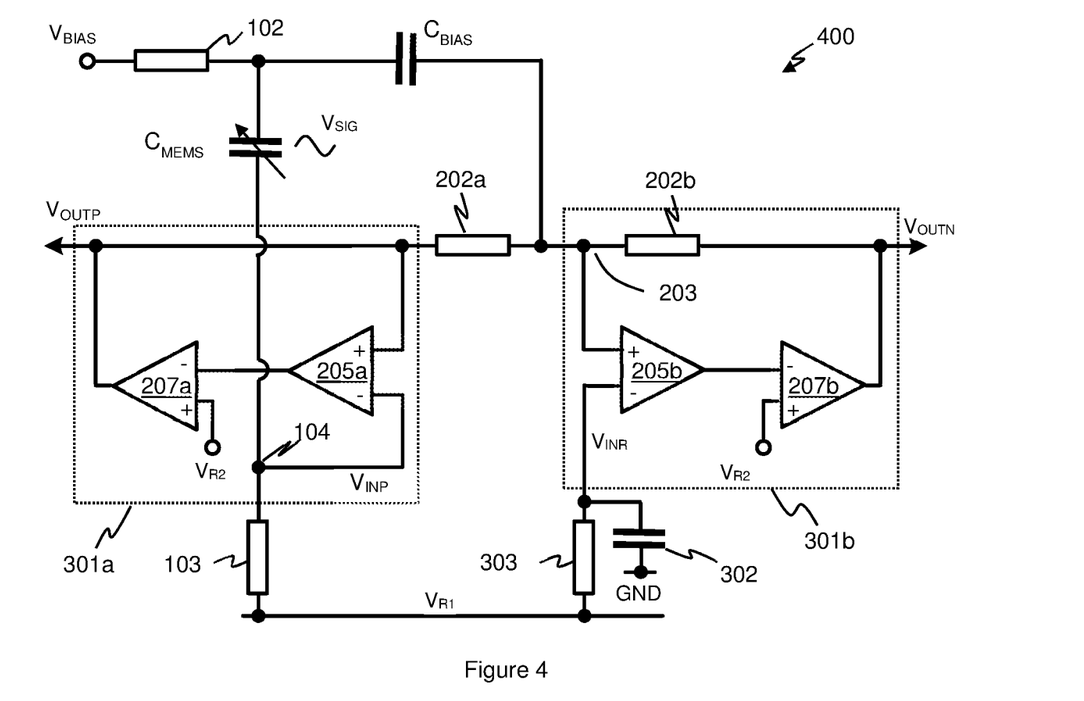
FIG. 4 illustrates an example of a MEMS sensor amplifier arrangement according to an embodiment in which a bias capacitance is referenced to a common-mode voltage node.

FIG. 4 illustrates another example of a MEMS sensor arrangement 400 according to an embodiment of the disclosure. The sensor arrangement 400 is similar to that described with reference to FIG. 3, but in this embodiment the bias capacitance $C_{BIAS}$ is coupled between the bias node for the MEMS capacitance and the common-mode node 203. FIG. 4 also illustrates in general the amplifiers 301a and 301b each have an input stage 205a/205b and an output stage 207a/207b. The input stage 205a/205b may be implemented by a transistor as described above with reference to FIG. 3, wherein the gate terminal is the inverting input for the input signal $V_{INP}/V_{INR}$, the source is the non-inverting input for a feedback signal and the drain is the output to the output stage and coupled to a current source 206a/206b. Other arrangements are possible however, for instance the input stage 207a/207b could be implemented as a differential pair or any of a number of other arrangements as would be understood by one skilled in the art.

The bias capacitance is thus referenced to the feedback voltage for input stage 205b of LNA 301b, which can be advantageous for noise reasons. In the arrangement of FIG. 3, noise from both input stage transistors 205a and 205b (and any noise due to the current sources 206a or 206b modulating the drain-source current of the relevant transistor) may contribute to the output signal. In particular noise from transistor 205b may modulate the voltage at its source, relative to the voltage of the source of 205a, which thus can result in twice this voltage appearing at the output $V_{OUTN}$. By contrast, in the arrangement of FIG. 4, to a first order, any noise induced on node 203 by the input stage 205b is coupled to the input signal $V_{INP}$ via the bias capacitance $C_{BIAS}$. As such, this noise arising from input stage 205b appears equally in both outputs $V_{OUTP}$ and $V_{OUTN}$ and thus is common-mode noise that can be removed by subsequent processing. This arrangement can thus allow noise from input stage 205b (e.g. noise from the input stage transistor and any noise due to the current sources 206b or from the reference $V_{R1}$ resulting in a modulation of the voltage at node 203) to manifest as common-mode noise that can be subsequently removed. In effect the bias voltage, at the bias node for the MEMS capacitive sensor, is modulated with a bias modulation signal that includes a component corresponding to any noise at the feedback terminal of the input stage of the second amplifier. In the example of FIG. 4, the modulation signal effectively contains just the noise component.

Figure 5:
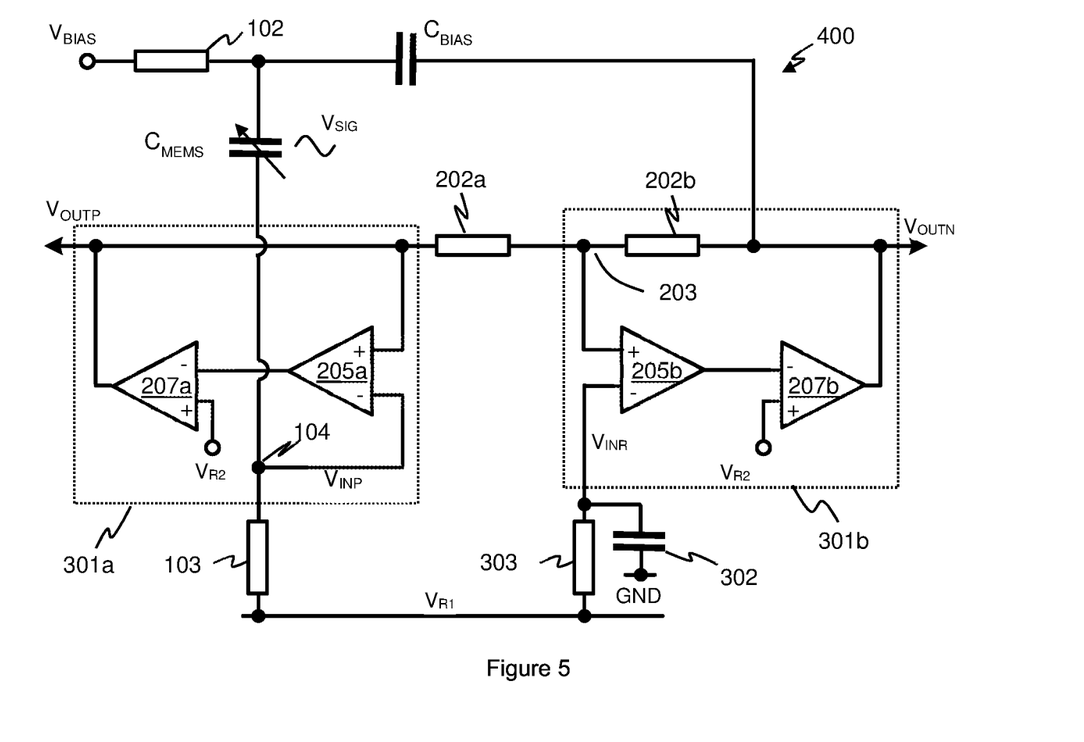
FIG. 5 illustrates an example of a MEMS sensor amplifier arrangement according to an embodiment in which a bias capacitance is referenced to an output signal.

Alternatively, the bias capacitance $C_{BIAS}$ could be referenced to the output voltage $V_{OUTN}$, as illustrated in the sensor arrangement 500 of FIG. 5. In this case any noise at node 203, e.g. the non-inverting feedback input of the input stage 205b, may result in noise at the output $V_{OUTN}$, but again, via feedback via $C_{BIAS}$ and $C_{MEMS}$, equivalent noise will appear in the output signal $V_{OUTP}$ and hence such noise will appear as common-mode noise in the differential output. However the arrangement of FIG. 5 also means that any variation in output signal $V_{OUTN}$ is thus imposed on MEMS capacitive sensor via the bias capacitor $C_{BIAS}$. Thus the modulation signal includes a signal component due to the generated output signal $V_{OUTN}$ as well as any noise component. Modulating the voltage at the bias node based on the output signal $V_{OUTN}$ can improve dynamic range in a similar fashion as discussed in relation to FIG. 2.

Any variation of the separation of the plates or electrodes of MEMS sensor $C_{MEMS}$ gives rise to a voltage variation $V_{SIG}$, which will tend to drive the input $V_{INP}$ in one direction. The operation of LNA 301b drives the output $V_{OUTN}$ in the opposite sense to maintain the common-mode voltage at node 203, and this variation is imposed on the first plate of MEMS capacitance $C_{MEMS}$.

Thus, in a similar manner as discussed above in relation to FIG. 2, of a stimulus on the MEMS sensor $C_{MEMS}$ gives to a voltage variation of ΔV, as the signals $V_{INP}$ and hence $V_{OUTP}$ vary, the signal $V_{OUTN}$ will vary in the opposite sense. Thus each of $V_{OUTP}$ and $V_{OUTN}$ will exhibit an equal and opposite variation of, in this example with unity gain, magnitude ΔV/2. As such the input signal $V_{INP}$ is half the magnitude, for a given signal voltage variation $V_{SIG}$, which effectively doubles the input range.

As noted above, in the arrangement of FIG. 5, with the bias capacitance $C_{BIAS}$ referenced to the output signal $V_{OUTN}$, any noise for input stage 205b at node 203 manifests as common-mode noise in the differential output. This may allow the noise requirements for any current sources of amplifier 301b to be relaxed compared to the requirements for current sources for amplifier 301a.

The coupling of noise from output $V_{OUTN}$ to the output $V_{OUTP}$, so that such noise becomes common-mode noise of the output, is thus beneficial in allowing suppression or removal of such noise by downstream processing. However, the coupling of noise from output $V_{OUTN}$ to the output $V_{OUTP}$ may be affected by attenuation of the signal by input stage 205a. In particular stray capacitance at the sense node 104, e.g. stray capacitance to ground or the drain of an input transistor of input stage 205a may be an issue.

Typically an input transistor of input stage 205a would be implemented as a relatively large transistor so as to provide acceptable performance for flicker noise. As such the gate drain capacitance of the transistor 205a may be relatively high, and a significant component of capacitance for the gate node. The input signal $V_{INP}$ can thus be attenuated due to the relatively significant gate-drain capacitance, which will attenuate the common mode noise signal component. The result is that only a proportion of the common mode noise of output signal $V_{OUTN}$ is coupled to the output $V_{OUTP}$ and becomes a differential component of the output.

Figure 6:
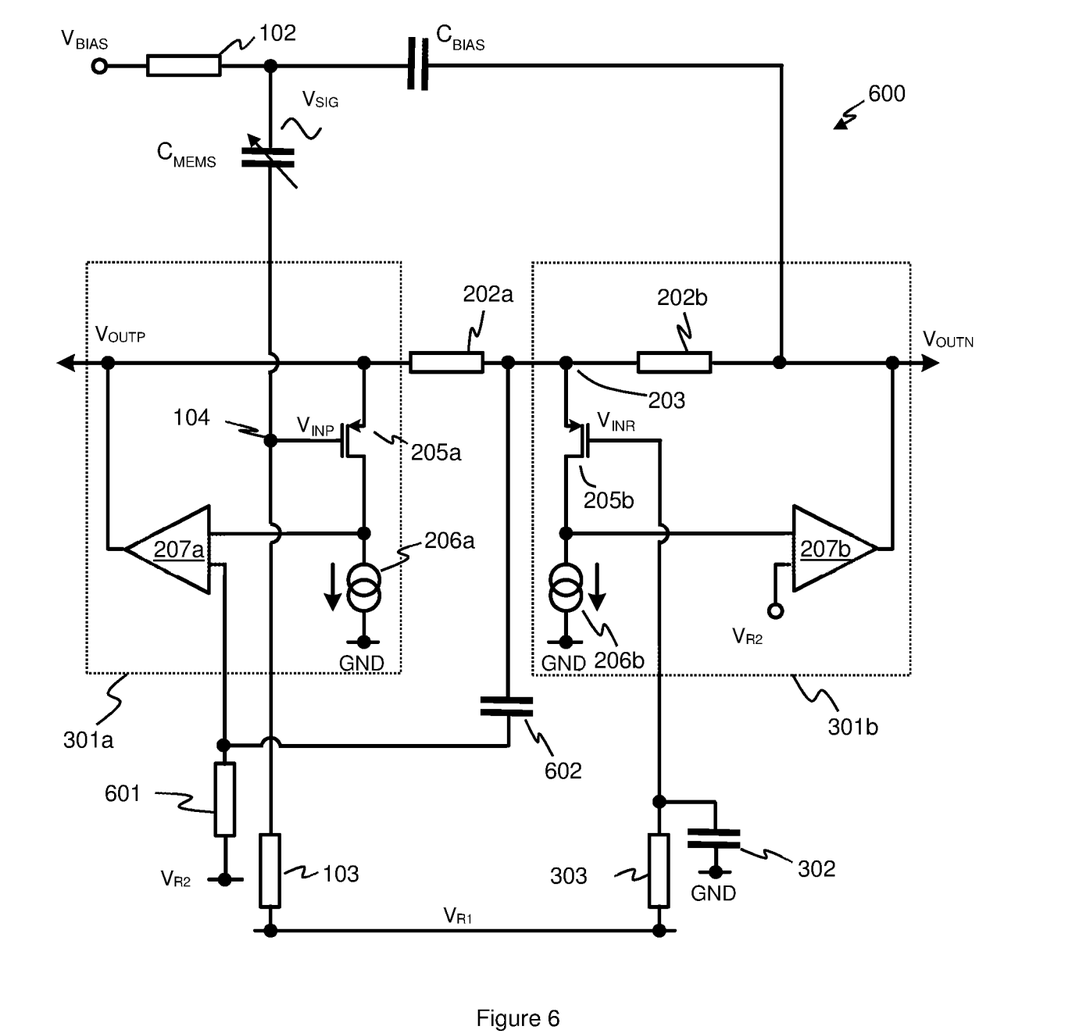
FIG. 6 illustrates an example of a MEMS sensor amplifier arrangement similar to that illustrated in FIG. 5 that reduces transfer of common-mode noise to the output.

FIG. 6 illustrates a further example of a MEMS sensor arrangement 600 according to an embodiment of the disclosure which mitigates this issue. FIG. 6 illustrates an embodiment where amplifiers 301a and 301b are implemented as source-follower amplifiers, with an input stage transistor 205a/205b and current sources 206a/206b. FIG. 6 illustrates that the output stage 207a of the LNA 301a is coupled to the reference voltage $V_{R2}$ via a path including high impedance element 601, which may for instance be implemented by polysilicon diodes. The common-mode node 203 is coupled, via capacitance 602, to a node of this reference voltage path which is between the high impedance element 601 and the output stage 207a. Any noise appearing at the common-mode node 203 due to the input stage 205b, will thus couple, via capacitance 602, onto the reference voltage $V_{R2}$ for the output stage 207a. In effect the voltage reference at the output stage 207a is modulated with a reference modulation signal that includes a component corresponding to any noise at the source terminal of input transistor 205b, i.e. at the common-mode node 203. The output of the input stage of amplifier 301a, i.e. the drain of transistor 205a, will follow variations to this voltage, which reduces or eliminates the attenuation of the noise component due to the gain-drain capacitance of the transistor 205a. Thus any noise at the source of transistor 205b, leading to corresponding noise in the output signal $V_{OUTN}$ will more effectively couple to the output signal $V_{OUTP}$ and be present as a common-mode component of the differential output.

Figure 7:
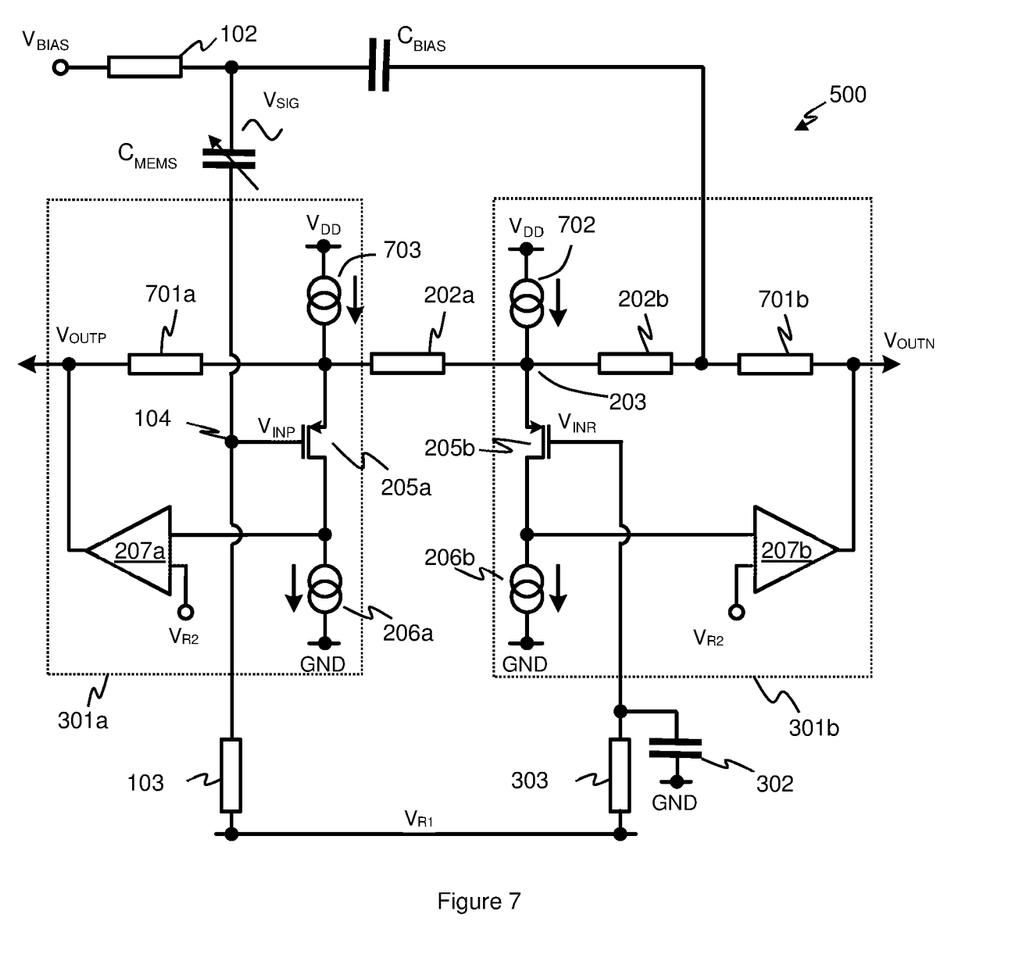
FIG. 7 illustrates an example of a MEMS sensor amplifier arrangement similar to that illustrated in FIG. 5 with gain resistances.

FIGS. 3 to 6 illustrate amplifier arrangements with unity gain. FIG. 7 illustrates a further example of a sensor arrangement 700 according to an embodiment which includes gain resistors 701a and 701b. The amplifier arrangement operates in a similar fashion as discussed above but the additional resistors 701a and 701b result in gain equivalent to ($R_{701}$+$R_{202}$)/$R_{202}$, where $R_{701}$ is the resistance of resistor 701a (and also 701b) and $R_{202}$ is the resistance of resistor 202a (and also 202b).

The gain resistors 701a and 701b may also help to reduce unwanted electromagnetic interference (EMI) as these resistors are located in a path between the outputs $V_{OUTP}$ and $V_{OUTN}$ and the sources of the input transistors 205a and 205b of the LNAs 301a and 301b.

In some instances optional current source 702 could be included in any of the described embodiments to provide current to the common-mode node 203. In some examples current source 703, may be employed to provide current to the feedback input of amplifier 301a, i.e. to the source of transistor 105a. Current sources 702 and 703 can be used to balance the currents due to current sources 206a and 206b and to avoid any unwanted and/or asymmetric current drop across impedances 202a and 202b and/or gain resistors 701a and 701b, for instance a quiescent current that could result in a voltage offset.

Figure 8:
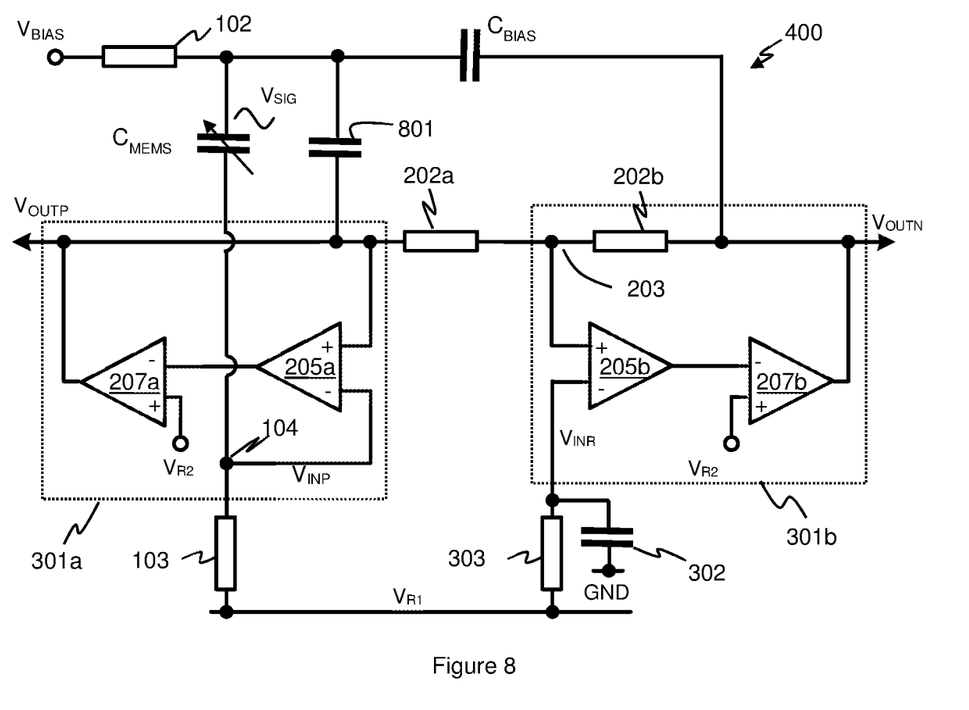
FIG. 8 illustrates an example of a MEMS sensor amplifier arrangement similar to that illustrated in FIG. 5 with a gain capacitance.

FIG. 8 illustrates a further example of a sensor arrangement 800 with gain. In this arrangement a gain capacitor 801 is coupled between the positive output $V_{OUTP}$ and the bias node for the MEMS capacitive sensor $C_{MEMS}$. In effect a proportion of the output signal is fed back and imposed on the first plate of the MEMS capacitive sensor $C_{MEMS}$ so as to provide a greater output signal for a given input variation. To maintain the common-mode voltage at node 203 to be constant, the LNA 301b drives the output $V_{OUTN}$ to be equal and opposite to $V_{OUTP}$.

The use of a gain capacitance such as illustrated in FIG. 8 avoid the need for gain resistors 701a and 701b discussed with reference to FIG. 7, and the noise associated with such resistors. However, as discussed in relation to FIG. 7, the presence of resistors 701a and 701b may provide a benefit in terms of filtering EMI that might be received via the output nodes. Thus the gain resistors of FIG. 7 may be implemented in applications where the outputs $V_{OUTP}$ and $V_{OUTN}$ may be susceptible to EMI. For example if the outputs $V_{OUTP}$ and $V_{OUTN}$ were, when packaged in a suitable microphone package, directly connected to some pads or contact terminals of the package, e.g. to output an analogue sensor signal, it may be advantageous to implement a variant including gain resistors. However, if the outputs $V_{OUTP}$ and $V_{OUTN}$ were instead coupled to some other component within the package, e.g. to an ADC to convert the outputs to digital signals, EMI via the outputs $V_{OUTP}$ and $V_{OUTN}$ may be less of a concern and a variant omitting any significant gain resistance as described with reference to FIG. 7 and instead implementing a gain capacitance as discussed with reference to FIG. 8 may be advantageously implemented.

Embodiments of the present disclosure thus provide amplifier circuitry for MEMS capacitive sensors that provide good linearity and noise performance over a relatively large operating range. In general the amplifier circuitry includes a first amplifier for receiving the input signal and generating a first output signal based on the input signal. A second amplifier is configured to output a second output signal which varies inversely with the first output signal. The second amplifier may have an input stage with a reference input connected to a first reference voltage and a feedback terminal connected to a node which is configured to be equal to a common-mode voltage of the first and second output signals. The input stage may provide an output to an stage driver, which outputs the second output signal.

Embodiments are particularly applicable to readout circuitry for MEMS capacitive transducers, and especially to MEMS microphones. However the principles may be applied to sensing signals from other transducers or other types of sensors. Embodiments may be arranged as part of an audio and/or signal processing circuit, for instance an audio circuit which may be provided in a host device. Embodiments of the invention also relate to MEMS or similar capacitive ultrasonic transducer circuits. A circuit according to an embodiment of the present invention may be implemented as an integrated circuit. A MEMS transducer may form part of the integrated circuit on a monolithic substrate or be connected to the integrated circuit in use.

Embodiments may be implemented as an integrated circuit which in some examples could be integrated with a MEMS transducer or designed to be co-packaged with a MEMS transducer die in a microphone package. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a wearable device such as a smartwatch. The device could be a device with voice control or activation functionality.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope

The invention claimed is:

1. Amplifier circuitry for amplifying an input signal from a MEMS capacitive sensor comprising:
   a first amplifier having an input for receiving the input signal and configured to output, at a first amplifier output, a first output signal based on the input signal;
   a second amplifier configured to output, at a second amplifier output, a second output signal which varies inversely with the first output signal;
   wherein the first amplifier output is connected to the second amplifier output via first and second impedances so that a voltage at a common-mode node between the first and second impedances is equal to a common-mode voltage of the first and second output signals; and
   wherein the second amplifier comprises:
       an input stage having an input terminal connected to a first reference voltage and a feedback terminal connected to the common-mode node; and
       an output stage connected between an output terminal of the input stage and the second amplifier output.

2. Amplifier circuitry as claimed in claim 1 further comprising biasing circuitry for generating a bias voltage for biasing the MEMS capacitive sensor at a biasing node wherein the amplifier circuitry is configured to modulate the bias voltage at the bias node with a bias modulation signal that includes a component corresponding to any noise at the feedback terminal of the input stage of the second amplifier.

3. Amplifier circuitry as claimed in claim 2 comprising a feedback path extending between the common mode node and the biasing node.

4. Amplifier circuitry as claimed in claim 2 wherein the bias modulation signal is based on the second output signal.

5. Amplifier circuitry as claimed in claim 4 comprising a feedback path extending between a node connected to the second amplifier output and the bias node.

6. Amplifier circuitry as claimed in claim 3 wherein the feedback path comprises a biasing capacitor.

7. Amplifier circuitry as claimed in claim 1 wherein the first amplifier comprises:
  an input stage configured to receive the input signal and a feedback signal from first amplifier output; and
  an output stage coupled between an output terminal of the input stage of the first amplifier and the first amplifier output.

8. Amplifier circuitry as claimed in claim 7 further comprising a current source coupled to feedback terminal of the input stage of the first amplifier.

9. Amplifier circuitry as claimed in claim 7 wherein the output stage of the first amplifier is configured to receive a second voltage reference and the amplifier circuitry is configured to modulate the second voltage reference at the output stage with a reference modulation signal that includes a component corresponding to any noise at the feedback terminal of the input stage of the second amplifier.

10. Amplifier circuitry as claimed in claim 9 wherein the common-mode node is connected to a reference voltage input of the output stage of the first amplifier via a capacitor and the reference voltage input is connected to the second voltage reference via an impedance element.

11. Amplifier circuitry as claimed in claim 7 comprising a first gain resistor coupled between the first amplifier output and the feedback terminal of the input stage of the first amplifier and a second gain resistor coupled between the second amplifier output and the feedback terminal of the input stage of the second amplifier.

12. Amplifier circuitry as claimed in claim 7 further comprising biasing circuitry for generating a bias voltage for biasing the MEMS capacitive sensor at a biasing node and a gain capacitance coupled between the bias node and the first amplifier output.

13. Amplifier circuitry as claimed in claim 1 wherein the input terminal of the second amplifier is connected to the first reference voltage via a second amplifier reference path that comprises an impedance element.

14. Amplifier circuitry as claimed in claim 13 comprising a filter capacitor connected to the gate reference path.

15. Amplifier circuitry as claimed in claim 1 wherein the input to the first amplifier is coupled to the first reference voltage via an first amplifier reference path that comprises an impedance element.

16. Amplifier circuitry as claimed in claim 1 wherein the input stage of the second amplifier comprises an input transistor having:
  a gate terminal configured as the input terminal;
  a source terminal coupled as the feedback terminal; and
  a drain terminal coupled to a second amplifier current source and configured as said output terminal of the input stage of the second amplifier.

17. Amplifier circuitry as claimed in claim 1 further comprising a MEMS capacitive sensor configured to generate, in use, the input signal.

18. An electronic device comprising amplifier circuitry as claimed in claim 1.

19. An amplifier apparatus for amplifying an input signal from a MEMS capacitive sensor comprising:
  a first op-amp configured to receive the input signal as an input and output a first output signal based on the input signal;
  a second op-amp configured to receive a reference voltage as an input and to output a second output signal which varies inversely with the first output signal, wherein an input stage transistor of the second op-amp is configured to receive a feedback at a source terminal from both the second output signal and the first output signal such that the voltage at the source terminal corresponds to a common-mode voltage of the first and second output signals.

20. Amplifier circuitry for amplifying an input signal from a MEMS capacitive sensor comprising:
  a first amplifier having an input for receiving the input signal and configured to output, at a first amplifier output, a first output signal based on the input signal;
  a second amplifier configured to output, at a second amplifier output, a second output signal which varies inversely with the first output signal;
  wherein the second amplifier comprises:
    an input transistor having a gate terminal connected to a first reference voltage; a source terminal connected a common-mode node; and a drain terminal connected to a current source; and
    an output driver connected between the drain terminal of the input transistor and the second amplifier output; and
  wherein the amplifier circuitry is configured such that, in use, a voltage at the common-mode node corresponds to a common-voltage of the first and second output signals.

* * * * *

UNITED STATES PATENT AND TRADEMARK OFFICE
CERTIFICATE OF CORRECTION

| | |
|---|---|
| PATENT NO. | : 10,873,295 B1 |
| APPLICATION NO. | : 16/599600 |
| DATED | : December 22, 2020 |
| INVENTOR(S) | : Paul Wilson |

It is certified that error appears in the above-identified patent and that said Letters Patent is hereby corrected as shown below:

In the Drawings

Please replace originally submitted drawing sheets 4, 6, and 7 with the attached Replacement Sheets 4, 6, and 7.

In the Specification

In Column 1, Line 15, delete "increasing popular," and insert -- increasingly popular, --, therefor.

In Column 1, Line 32, delete "10 GO." and insert -- 10G$\Omega$. --, therefor.

In Column 2, Line 59, delete "an first" and insert -- a first --, therefor.

In Column 3, Line 30, delete "and/r" and insert -- and/or --, therefor.

In Column 3, Line 43, delete "connected a" and insert -- connected to a --, therefor.

In Column 4, Line 57, delete "VIN" and insert -- $V_{IN}$ --, therefor.

In Column 4, Line 62, delete "VIN" and insert -- $V_{IN}$ --, therefor.

In Column 5, Line 1, delete "VIN." and insert -- $V_{IN}$. --, therefor.

In Column 5, Line 6, delete "Vdd" and insert -- VDD --, therefor.

In Column 5, Line 30, delete "VIN" and insert -- $V_{IN}$ --, therefor.

In Column 5, Line 32, delete "transient artefacts" and insert -- transient artifacts --, therefor.

In Column 9, Line 29, delete "via feedback via" and insert -- via feedback --, therefor.

Signed and Sealed this
Twentieth Day of August, 2024

*Katherine Kelly Vidal*

Katherine Kelly Vidal
*Director of the United States Patent and Trademark Office*

In Column 11, Line 48, delete "an stage" and insert -- a stage --, therefor.

In Column 12, Line 34, delete "limit the" and insert -- limiting the --, therefor.

In Column 12, Line 42, delete "scope" and insert -- scope. --, therefor.

In the Claims

In Column 14, Line 3, in Claim 15, delete "an first" and insert -- a first --, therefor.

In Column 14, Lines 42-43, in Claim 20, delete "connected a" and insert -- connected to a --, therefor.